US007855488B2

(12) United States Patent
Feltz et al.

(10) Patent No.: US 7,855,488 B2
(45) Date of Patent: Dec. 21, 2010

(54) PIEZOCERAMIC DEVICE

(75) Inventors: Adalbert Feltz, Deutschlandsberg (AT); Sigrid Gansberger, Graz (AT); Heinz Florian, Bad Gams (AT); Harald Kastl, Bad Gams (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 11/406,587

(22) Filed: Apr. 19, 2006

(65) Prior Publication Data

US 2006/0251911 A1 Nov. 9, 2006

Related U.S. Application Data

(63) Continuation of application No. 09/736,266, filed on Dec. 15, 2000, now abandoned.

(30) Foreign Application Priority Data

Dec. 16, 1999 (DE) ................ 199 60 849

(51) Int. Cl.
*H01L 41/047* (2006.01)
*H01L 41/083* (2006.01)
(52) U.S. Cl. ................ 310/328; 310/364; 310/358
(58) Field of Classification Search ........... 310/328, 310/365, 358; 501/134
See application file for complete search history.

(56) References Cited

U.S. PATENT DOCUMENTS

| 4,128,489 | A | | 12/1978 | Seo |
| 4,347,167 | A | * | 8/1982 | Payne et al. ............ 252/520.21 |
| 4,353,958 | A | | 10/1982 | Kita et al. |
| 4,755,493 | A | * | 7/1988 | Takeuchi et al. ............ 501/134 |
| 4,917,810 | A | | 4/1990 | Tsunooka et al. |
| 4,988,909 | A | * | 1/1991 | Hagimura et al. ........... 310/358 |
| 5,004,715 | A | * | 4/1991 | Hakotani et al. ............ 501/136 |
| 5,036,425 | A | | 7/1991 | Omori |
| 5,112,433 | A | | 5/1992 | Dawson et al. |
| 5,210,455 | A | * | 5/1993 | Takeuchi et al. ............ 310/328 |
| 5,233,260 | A | | 8/1993 | Harada et al. |
| 5,340,510 | A | * | 8/1994 | Bowen ....................... 264/434 |
| 5,376,857 | A | * | 12/1994 | Takeuchi et al. ............ 310/358 |
| 5,390,949 | A | * | 2/1995 | Naganathan et al. ..... 280/5.515 |
| 5,433,917 | A | | 7/1995 | Srivastava et al. |
| 5,578,539 | A | * | 11/1996 | Glaubitt et al. ............ 501/134 |
| 5,648,012 | A | | 7/1997 | Higashibeppu et al. |
| 6,080,328 | A | | 6/2000 | Horikawa |
| 6,232,701 | B1 | | 5/2001 | Schuh et al. |
| 6,236,146 | B1 | | 5/2001 | Cramer et al. |
| 6,255,037 | B1 | | 7/2001 | Kanoh et al. |
| 6,266,230 | B1 | | 7/2001 | Kato et al. |
| 6,320,738 | B1 | | 11/2001 | Yamana et al. |
| 6,370,014 | B1 | * | 4/2002 | Yoneda .................... 361/321.2 |
| 6,613,705 | B1 | | 9/2003 | Feltz et al. |
| 6,692,598 | B1 | * | 2/2004 | Yamana et al. ........... 156/89.12 |
| 6,842,329 | B2 | | 1/2005 | Feltz et al. |
| 7,358,655 | B2 | * | 4/2008 | Ragossnig et al. .......... 310/358 |
| 2002/0098333 | A1 | * | 7/2002 | Feltz et al. ................. 428/210 |
| 2006/0119228 | A1 | * | 6/2006 | Florian et al. .............. 310/358 |
| 2006/0226569 | A1 | * | 10/2006 | Henneck et al. ............ 264/102 |
| 2008/0203853 | A1 | * | 8/2008 | Schuh et al. ................ 310/328 |
| 2008/0245991 | A1 | * | 10/2008 | Bamiere et al. ........ 252/62.9 PZ |
| 2008/0282536 | A1 | * | 11/2008 | Bamiere et al. ............... 29/846 |

FOREIGN PATENT DOCUMENTS

| DE | 40 05 505 | | 8/1990 |
| DE | 19749858 | C1 | 4/1999 |
| DE | 199 16 380 | A1 | 10/1999 |
| DE | 19841487 | A1 | 3/2000 |
| DE | 199 46 834 | | 5/2001 |
| DE | 10062672 | A1 * | 8/2001 |
| JP | 03 060 463 | A | 3/1991 |
| JP | 04074777 | A * | 3/1992 |
| JP | 04171990 | | 6/1992 |
| JP | 04324687 | | 11/1992 |
| JP | 05 190 376 | A | 7/1993 |
| JP | 07 277 822 | A | 10/1995 |
| JP | 08 167 536 | A | 6/1996 |
| JP | 8-301654 | | 11/1996 |
| JP | 09 157 006 | A | 6/1997 |
| JP | 10-17364 | | 1/1998 |
| JP | 11-49572 | | 2/1999 |
| JP | 11 292 625 | A | 10/1999 |
| JP | 11-307307 | | 11/1999 |
| JP | 11-330705 | | 11/1999 |
| JP | 11-345745 | | 12/1999 |
| WO | WO 97/40537 | | 10/1997 |
| WO | WO 01/24287 | A2 | 4/2001 |

OTHER PUBLICATIONS

Junichi Kato et al., "Dielectric Material in Lead-Based Perovskite and . . . ", pp. 54-69, Ceramic Transactions, vol. 8, 1990.
Heng C. Cao et al., "Structure and Properties at the Ferroelectric/ . . . ", Journal of the American Ceramic Society, pp. 3019-3023, vol. 76, No. 12, (1993).
Proceedings of the Eleventh IEEE Int'l Symposium in Applications of Ferroelectrics, pp. 559-562, IEEE Cat. No. 98CH36245, Aug. 24-27, 1998.
Marianne Hammer et al., "Detailed X-ray Diffraction Analyses and . . . ", Journal of Electroceramics 2:2, pp. 74-84 (1998).
Yuhuan Xu, "Ferroelectric Materials and Their Applications", pp. 101-163 (1991), Elsevier Science Publishers.
G.H. Haertling et al., "Hot-Pressed (Pb, La)(Zr, Ti)O3 Ferroelectric . . . ", pp. 1-11, Journal of The American Ceramic Society, vol. 54, No. 1, Jan. 1971.

(Continued)

*Primary Examiner*—J. SanMartin
(74) *Attorney, Agent, or Firm*—Cohen, Pontani, Lieberman & Pavane LLP

(57) ABSTRACT

The present invention relates to a piezoelectrical device whose electrode layers contain copper. The usage of copper in electrode layers is enabled by a debindering process, which is carried out by steam.

25 Claims, 5 Drawing Sheets

OTHER PUBLICATIONS

Gene H. Haertling, "Hot-Pressed Lead Zirconate-Lead Titanate . . .", pp. 875-879, Ceramic Bulletin, vol. 43, No. 12 (1964).

B. Jaffe et al., "Piezoelectric Ceramics", pp. 1-317, Academic Press London, Feb. 1981.

Keigo Hirakata et al., "Multilayer Capacitors with Copper Inner Electrodes", Ferroelectrics, 1992, vol. 133, pp. 139-144 (1992).

Kunihiro Nagata, "Properties of Piezoelectric Ceramics Sintered in Reducing Atmosphere", Dept. of EE, National Defense Academy, vol. 30, #9B, Sep. 1991, pp. 2224-2227.

Fumio Uchikoba et al., "Processing and Characterization of Copper Internal Electrode Multilayer Capacitors", The American Ceramic Society, Ceramic Transactions, vol. 32, 1993, pp. 101-110.

Translation of Y. Yokotani, "Ceramic Layer Capacitor having an Internal Copper Electrode", Kinou-Zairyo (functional materials), vol. 11, No. 4, Apr. 1991, pp. 38-346.

T. Takenaka et al., "Ferroelectric and Piezoelectric Properties of Lead-Free (Bi1/2Na1/2)TiO3-KNbO3-1/2(Bi2O3xSc2O3) Ceramics", Proceedings of the Eleventh IEEE Int'l. Symposium in Applications of Ferroelectrics, Montreux 1998, IEEE Cat. No. 98CH36245, Aug. 24-27, 1998, pp. 559-562.

Gene H. Haertling, "Hot-Pressed Lead Zirconate-Lead Titanate Ceramics containing Bismuth", pp. 875-879, American Ceramic Bulletin, vol. 43, No. 12, pp. 875-879, (1964).

Kunihiro Nagata, "Properties of Piezoelectric Ceramics Sintered in Reducing Atmosphere", Japanese Journal of Applied Physics, Part 1, vol. 30, No. 9B, Sep. 1991, pp. 2224-2227.

Examination Report dated Aug. 1, 2006 for Japanese Patent No. 2001-545341 (204789C).

English translation of the Examination Report issued August 1, 2006 by the Japanese Patent Office in Japanese Patent Application No. 2001-545341.

Jaffe, B. et al., "Piezoelectric Ceramics", pp. 1-317, Academic Press London and New York (1971).

Schaumburg H., "Keramik"; B. G. Teubner 1994, ISBN 3-519-06127-9, p. 303, pp. 395-398, pp. 464-465.

* cited by examiner

PIEZOCERAMIC DEVICE

CROSS REFERENCE TO RELATED APPLICATIONS

This application is a Continuation of U.S. patent application Ser. No. 09/736,266, filed Dec. 15, 2000, now abandoned, which claims priority from Application filed in Germany on Dec. 16, 1999, No. 199 60 849. The disclosure of U.S. patent application Ser. No. 09/736,266 is incorporated herein by reference.

FIELD OF THE INVENTION

The present invention relates to a piezoceramic device and a method for manufacturing it wherein the device includes a stack of at least two ceramic layers and an electrode layer arranged between two ceramic layers.

Such devices may comprise a plurality of layers and uses. For example, they may be used in: actuators for effecting a low-inertia mechanical vibration of comparably high force via application of a select control voltage; bending elements to effect a high mechanical vibration of less force via application of select control voltage; or production of high electrical voltages. Piezoceramic devices may serve to detect mechanical acoustic vibrations and/or serve in their production via implementation in relevant devices.

In the manufacture of piezoceramic devices, technical solutions have up until now been predominantly based on ceramic masses of the Perovskite structure type with the general formula $ABO_3$. Herein, the piezoelectrical characteristics are brought to bear in a ferroelectrical condition. Lead zirconate titanate ceramics $Pb(Zr_{1-x}Ti_x)O_3$=PZT, modified with select additives, have been shown to demonstrate particular advantages. The combination of ceramics and additives is tailored to the so-called morphotropic phase interface of two co-existing ferroelectrical phases: a tetragonal and a rhombodic phase. Between the ceramic layers, produced according to known methods of ceramic foil technology, precious metal internal electrodes are applied by screen printing, The electrodes may comprise Ag/Pd in the molar ratio 70/30. At up to several hundred electrode layers, the piezoceramic devices are burdened with substantial costs. The precious metal electrodes permit the elimination of thermal dispergers and binders as well as other organic additives used in the process of ceramic foil production. Likewise organic components of screen printing-metal paste of the multilayer stacks are eliminated via air depolymerisation and oxydation such that a later sinter condensation at approximately 1100° C. to 1150° C. is made possible without damaging effects. Such effects may for example be effected by residual carbon which negatively influences the characteristics of the ceramics due to reduction reactions.

DESCRIPTION OF THE RELATED ART

Examples of $La_2O_3$ or $Nd_2O_3$ doped $Pb(Zr,Ti)O_3$ ceramics are documented in the literature, including by G. H. Haertling in the *American Ceramic Society Bulletin* (43(12), 875-879 (1964) and *Journal of the American Ceramic Society* 54, 1-11 (1971) as well as in *Piezoelectric Ceramics*, Academic Press, London and New York (1971) of B. Jaffe, W. R. Cook and H. Jaffe. Additional discussion may be found in Y. Xu in *Ferroelectric Materials and their Applications*, pages 101-163, Elsevier Science Publishers, Amsterdam (1991).

$La_2O_3$—in particular $Nd_2O_3$—additives induce the production of cation vacancies in the Pb positions of the crystal structure and at the same time increase the tendency to act as donors, particularly at insufficient oxygen partial pressure, which can lead to a depression of the insulating resistance and a rise in the dielectrcial losses. i.e. the sensitivity of the ceramic towards reduction is increased. At the same time, the additives stabilize the tetragonal phase and the kinetics of the orientation of the domains in the field direction at the polarity, i.e. the electro-mechanical behavior of the "soft piezoceramic" is influenced positively by such additives. For an advancement of the sinter condensation and prevention of evaporation losses of PbO in the ceramic, a low PbO surplus at the originally weighed-in composition is generally considered. The relationship between doping level by $La_2O_3$, in a $Pb(Zr_{0.47}Ti_{0.53})O_3$-ceramic (supplied with 3 molar-% PbO surplus) is discussed in the *Journal of Electroceramics* 2(2), 75-84 (1998) by M. Hammer and M. Hoffmann. In the journal, the sinter behavior and stricture formation associated therewith and electro magnetic characteristics (such as coupling factor) and dielectricity constant (such as curie temperature, maximum temperature for ferroelectrical) as well as associated piezoelectrical behavior are all examined.

Ceramic masses with bismuth oxide in place of lead oxide (for example $(Bi_{0.5}Na_{0.5})TiO_3$—$KNbO_3$—$BiScO_3$) were also taken into consideration by T. Takenaka and H. Nagata in *The Proceedings of the 11$^{th}$ International Symposium of Applied Ferroelectrics*, Montreux 1998, IEEE 98CH36245, 559-562 (1998). Herein, $Pb(Ti_xZr_{1-x})O_3$ was combined with $BiScO_3$ and/or $BiInO_3$. All of these ceramics are based on Perovskite mixed crystal phases which, in combination with Ag/Pd internal electrodes, produce a relatively positive behavior for the purpose of a piezostack when the debindering (the removal of the binder or binders) and the sinter condensation is performed.

Piezoelectrical ceramic masses of the general composition $(Pb_{1-x-\alpha-y}Sr_xNa_\alpha M_y)_a[(Nb_bY_cCr_dCo_eSb_\beta)_fTi_gZr_{1-f-g}]O_3$ are set out in U.S. Pat. No. 5,648,012 and are distinguished by high electro-mechanical coupling factors, whereby M is at least a rare earth metal of La, Gd, Nd, Sm and Pr and the parameter areas $0.005 \leq x \leq 0.08$, $0.002 \leq y \leq 0.05$, $0.95 \leq a \leq 1.105$, $0.47 \leq b \leq 0.70$, $0.02 \leq c \leq 0.31$, $0.11 \leq d \leq 0.42$, $0.01 \leq e \leq 0.12$, $0.02 \leq f \leq 0.15$, $0.46 \leq g \leq 0.52$, $0 \leq \alpha \leq 0.005$, $0 \leq \beta \leq 0.13$ such that $b+c+d+e+\beta=1.00$ are effected.

The publication WO 97/40537 discloses the production of green foils for piezoceramic multilayer devices. The green foils are based on a piezoceramic powder of the type PZT, to which a stochiometric surplus of a heterovalent rare earth metal (up to a content from 1 to 5 molar-%) and a stochiometric surplus of an additional 1-5 molar-% lead oxide is added. In addition, it is disclosed in above publication that $Ag^+$-ions from the area of Ag/Pd internal electrodes diffuse into the ceramic layers of the multilayer devices such that the heterovalent doping produced cation vacancies are occupied and accordingly result in a filled up Perovskite structure. This structure may be: $Pb_{0.99}Ag_{0.01}La_{0.01}[Zr_{0.30}Ti_{0.36}(Ni_{1/3}Nb_{2/3})_{0.34}]O_3$ or $Pb_{0.96}Ag_{0.02}Nd_{0.02}(Zr_{0.54}, Ti_{0.46})O_3$. Herein, a piezoceramic is produced with a comparatively high Curie temperature for applications of up to 150° C. Furthermore, solidity between the Ag/Pd internal electrode (70/30) and the ceramic, as well as growth during the sintering, are positively influenced by building silver into the ceramic.

U.S. Pat. No. 5,233,260 discusses piezoactuators which are not produced in the traditional monolithic manner. Rather, the ceramic layers are separately sintered and only then stacked and agglutinated. This production method is costly. Furthermore, these piezoactuators have the disadvantage that the glue used has a negative effect the electrical characteristics.

Cao et al. in the journal *American Ceramic Society* 76(12) 3019 (1993) discuss a donor doped ceramic and in particular, a Cu foil laid between pre-made ceramic segments $Pb_{0.988}(Nb_{0.024}Zr_{0.528}Ti_{0.473})O_3$. The sandwich arrangement is subject to sintering at 1050° C. under vacuum. The composite between the ceramic and Cu internal electrode and the absence of the migrational effects (such as those observed at Ag electrodes on air) are emphasized in the article. However, the disclosed method does not lend itself to the requirements of an efficient production, including foil multilayer technology, and is therefore not appropriate for a mass production.

Kato et al. teach, in *Ceramic Transactions* Vol. 8, pages 54-68 (1990), of the production of multilayer condensators with Z5U based on ceramics having the general formula $(Pb_a\text{—}Ca_b)(Mg_{1/3}Nb_{2/3})_xTi_y(Ni_{1/2}W_{1/2})_zO_{2+a+b}$ (a+b>1, x+y+z=1) with Cu internal electrodes, wherein a copper oxide screen-printing paste is used. Air-debindering is thereby made possible. The carbon formation, which would inevitably come into effect under nitrogen at a well tolerated metallic copper (with oxygen) partial pressure, and afterwards at the sinter condensation, leads to a reductive degradation of the ceramic with Cu/Pb alloying production the eutectic melting point lying at TS=954° C. is thereby avoided. After the debindering, the sinter condensation is then carried out at 1000° C. by additional dosage of hydrogen at an oxygen partial pressure of $10^{-3}$ Pa and the copper oxide is accordingly reduced to copper. The process is interference-prone, because of the shrinkage during the reduction from copper oxide to copper and resulting delamination and has up to now not been technologically converted into products.

DE 19749858 C1 sets out the production of COG with internal electrodes formed of a ceramic mass with the general composition $(Ba^{II}_{1-y}Pb_y)_{6-x}Nd_{8+2x/3}Ti_{18}O_{54}+z$ m-% $TiO_2+p$ m-% Glas at lower PbO content (0.6<x<2.1; 0<y<0.6, 0<z<5.5 and 3<p<10). A sufficient elimination of the organic components by feeding steam into the nitrogen flux with <$10^{-2}$ Pa oxygen partial pressure at temperatures up to 680° C. and the sinter condensation at 1000° C. is reached by apt glass frit addititives.

BRIEF SUMMARY OF THE INVENTION

An advantage of the present invention provides an alternative to the expensive Ag/Pd internal electrodes used in the related art. It is a further advantage to provide a substitution which does not oxidize and remains relatively stable during production. It is still a further advantage to provide a method which can be implemented to enable mass production at reasonable engineering effort and expense and with maximally replicable component characteristics. These and other advantages are realized by the present invention wherein, copper is substituted for Ag/Pd for use in a PZT-type piezoceramic multilayer element. Copper has been shown not to reduce or oxidize and otherwise remain stable under conditions, including temperatures around 1000° C. under low oxygen partial pressure of <$10^{-2}$.

The present invention encompasses all piezoceramic devices available in a monolithic multilayer formation, and in particular Perovskit ceramic. Modifications by mixed crystal formation via building in cations on the-A positions and/or substitution of the B-cations with suitable replacement cations or combinations thereof can be effected. Ceramic foil production techniques may be employed along with sintering techniques in the formation of the present invention. For example, screen printing can be used for making the copper or copper mixed internal electrodes.

Such piezoceramic multilayer devices can be realized for example as actuators by an apt process guide, by which the debindering of the green foil stacks is carried out by steam thereby avoiding the oxidation of the copper containing internal electrodes. The following sinter condensation to a monolithic multilayer device can be carried out in an advantageous ways at about 1000° C., i.e. below the melting temperature of the copper.

A further advantage of the present invention may be found in that for a PZT ceramic mass, copper-containing internal electrodes are applied in place of the normally used Ag/Pd internal electrodes (70/30) on the basis of the multilayer foil technique, whereby the practically complete debindering can be successfully done before effecting the sinter condensation, and under inert conditions, in such a way that a lot of steam is supplied to the inert atmosphere during the debindering thereby permitting only a set oxygen partial pressure, and hence leaving the copper containing internal electrodes relatively intact. Accordingly, by the present method, piezoactuators are created which have the same if not superior quality to those currently available. Likewise, the presence of the copper electrodes do not have any deliterious effects on the piezoactuators.

A preferred step in the present method includes a step wherein cations are built in on A-positions of the ceramic and at which cations on B-positions are replaced by apt other cations or combinations of cations. For example, on A-positions of the ceramic bivalent metal cations $M^{II}$ may be built. These can be selected for example from a group of elements, which contain barium, strontium, calcium, copper and bismuth. Bivalent metal cations $M^{II}$ from a group of elements including scandium, yttrium, lantanum or from group of lanthanides can be considered for the A-positions of the ceramic.

Further, monovalent cations can be built in on the A-positions of the ceramic, which are selected advantageously and from a group of elements which contains silver, copper, sodium and potassium. In addition it is also possible, to build in combinations of bivalent metal cations $M^{II}$ and monovalent cations on A-positions.

Furthermore, a preferred embodiment includes the partial substitution of the quadrivalent cations Zr and Ti on the B-positions of the ferroelectrical Perovskite ceramic. In fact, combinations of mono-and quintvalent metal cations $M^{I}_{1/4}M^{V}_{3/4}$ with $M^{I}$=Na, K and $M^{V}$=Nb, Ta or two-and quintvalent metal cations $M^{II}_{1/3}M^{V}_{2/3}$ with $M^{II}$=Mg, Zn, Ni, Co and $M^{V}$=Nb, Ta or three-and quintvalent metal cations $M^{III}_{1/2}M^{V}_{2/3}$ with $M^{III}$=Fe, In, Sc, heavier lanthanide-elements and $M^{V}$=Nb, Ta or combinations $M^{III}_{2/3}M^{V}_{1/3}$ with $M^{III}$=Fe, In, Sc, heavier lanthanide-elements and $M^{VI}$=W resp. $M^{II}_{1/2}M^{VI}_{1/2}$ with $M^{II}$=Mg, Co, Ni and $M^{VI}$=W may be employed.

Still a further advantage includes the composition of the ceramic with the general formula $Pb_{1-x-y}SE_xCu_yV'''_{x/2}(Zr_{0.54-z}Ti_{0.46+z})O_3$ wherein 0.01<x<0.05, −0.15<z<+0.15 and 0<y<0.06, whereby SE is a rare earth metal, V is a vacancy and a PbO-surplus is set from 1 up to maximally 5 molar-%.

Yet further, atop the ceramic an additive of CuO may be included.

The invention includes the realization that the by donors, e.g. a rare earth metal doped piezo ceramic on the basis of PZT, because of the formation of cation vacancies on the A-positions of the Perovskit structure, e.g. according to the composition $Pb^{II}_{0.97}Nd^{III}_{0.02}V'''Pb,0.01(Zr_{0.54}Ti_{0.46})O_3$ (V''' meaning an empty space), develops a certain affinity to absorb copper from the internal electrodes without destroying them by elimination of equivalent PbO-shares, whereby the latter combination acts as a sinter aid and up to some percentage of PbO is separately added to the ceramic anyway.

The sinter condensation is supported by the known mobility of the copper ions and leads, by the copper migration, to a solid adhesion between the electrode layer and ceramic such that delaminations can be effectively avoided.

It is still further an advantage to already add some CuO within the limits 0<y<0.15 to the original mixture of the used recipe for piezostacks, e.g. on the basis of PZT with Cu-internal electrodes corresponding to the general formula $Pb^{II}_{1-x-y}SE^{III}_xCu_yV'''_{x/2}(Zr_{0.54-z}Ti_{0.46+z})O_3$ with 0.005<x<0.05 and −0.15<z<+0.15 (SE=Rare Earth Metal). The piezoelectrical characteristics, like the high value for the electromechanical coupling factor can be maintained at corresponding adjustment of the parameter z to the morphotropic phase interface.

BRIEF DESCRIPTION OF THE SEVERAL VIEWS OF THE DRAWING

Some of the features, advantages, and benefits of the present invention having been stated, others will become apparent as the description proceeds when taken in conjunction with the accompanying drawings wherein.

DETAILED DESCRIPTION OF THE INVENTION

Figure 1:
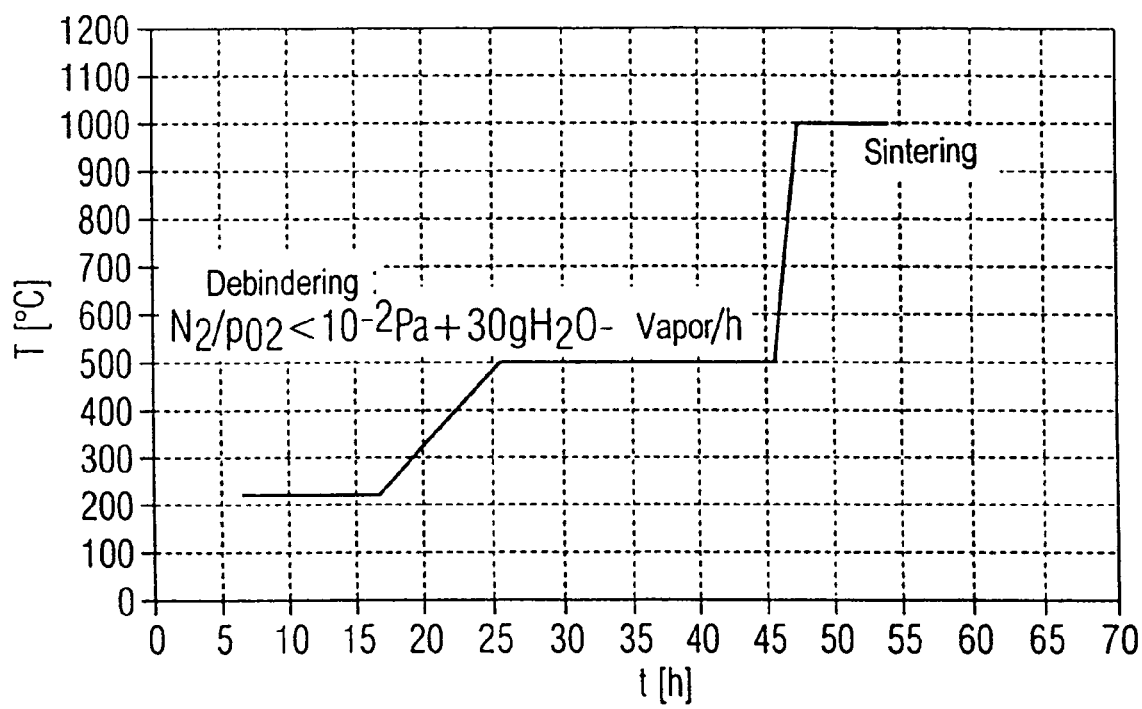
FIG. 1 depicts temperature control during debindering and sintering.

A piezoceramic Perovskite-mixed crystal phase is built according to the following steps: $TiO_2$, $ZrO_2$ (each may be from a mixed precipitation produced precursor $(Zr, Ti)O_2$) and $PbCo_3$ (e.g. $Pb_3O_4$ and dopants like $La_2O_3$ or from another oxyde of the rare earth metals) and if necessary an additive of CuO based raw material mixture is set in its composition on the morphotropic phase interface with a PbO-surplus of maximally 5% to support the sinter condensation; for even distribution, the component undergoes a grinding step in diluted suspension and is calcinated after the filtering; and drying occurs at 900 to 950° C. To obtain sinter condensation in 2 to 4 hours at about 1000° below the melting temperature of copper, a pulverization to a medium grain size <0.4 μm is necessary. The sinter activity of the powder is normally sufficient to guarantee a condensation of >96% of the theoretical density at both sufficient grain growth and adequate mechanical solidity in the ceramic structure.

The finely ground powder is suspended in a diluted slip with approx. 70 m-% solid substance content by use of a disperger, thus corresponding to approximately 24 vol.-%. For this, the optimal dispersing dispergator portion is separately determined in a series of tests, which can be recognized by obtaining a certain viscosity minimum. For the formation of the piezoceramic-green foils, approximately 6 m-% of a commercial binder is added to the dispersed suspended solids, which is thermohydrolytically degradable. Accordingly, a diluted polyurethane dispersion has been shown to have advantage effects. It is mixed in a disperse mill and accordingly provided for the process of "foil-pulling" (in particular for the production of a spraying granular apt slip).

Compact green discoids (produced from the granular) or small square multilayer printed boards ("MLP" produced by stacking and laminating 40 to 50 μm thick green foils without print and with Cu-electrode paste) can be debindered up to a residue carbon content of 300 ppm in a $H_2O$-steam containing inert atmosphere at a defined oxygen partial pressure, which fulfills the condition of the coexistence of PbO and in particular $Bi_2O_3$-containing piezoceramic and copper.

The hydrolytical separation of the binder takes place primarily at a low temperature of 200±50° C. and at a steam partial pressure larger than 200 mbar. The oxygen partial pressure is set to a value which is well-tolerated by the copper containing electrodes. This is done by gettering the oxygen from the flow of gas at surfaces of Cu or by adding $H_2$. During the debindering by oxidation, the flow of gas avoids damage to the ceramic. Although the electrode layers support the debindering, because preferred paths for a binder transportation is created by them, there is still a considerable debindering time necessary, particularly for the actuators with 160 electrodes (measurements 9,8*9,8*12,7 mm³).

The invention enables herewith the production of actuators with more than 100 internal electrodes, which has the advantage of a highly obtainable actuator-excursion. Examples for a debindering control are found in table 1 by indicating the residue carbon content of the obtained devices. The dew point for steam of both debindering programs lies at 75° C., the partial pressure of the steam corresponds to 405 mbar.

TABLE 1

| Debindering of ceramic samples MLP and actuators | | | |
|---|---|---|---|
| Profile | Conditions (R: ramp, H: holding time) | Samples | C |
| EK 1 | R: 30 K/h H: 220° C./10 h<br>R: 30 K/h H: 500° C./20 h,<br>at 100 l/h $N_2$, 30 g/h $H_2O$,<br>with Cu-gettering | Ceramic samples MLP | 240 |
| EK 2 | R: 30 K/h H: 220° C./40 h R: 30 K/h<br>H: 500° C./20 h, at<br>100 l/h $N_2$, 30 g/h $H_2O$,<br>with Cu-gettering | Actuator 160 electrodes | 300 ± 30 |

The soaking time at 220° C. is prolonged to 40 h for actuators with 160 layers (EK 2). Afterwards a condensation of the ceramic at 1000° C. without detrimental reductive degradation is effected with the residue carbon of 300±30 ppm in the indicated sinter profile.

FIG. 1 shows the temperature control during the debindering and sintering. The steam partial pressure supplied with the nitrogen flux corresponding to a dew point of 75° C. is indicated as well. At such debindered PZT-ceramic samples, the sinter condensation is effected at 1000° C. without creating a reductive degradation of the ceramic. The dielectrical and especially the piezoelectrical characteristics of the obtained samples with the measurements of approximately 10.10 mm² and 0.7 (in particular 2 mm consistency) are measured after contacting by sputtering of Au-electrodes and compared with the air-debindered (sintered at 1130° C.) samples of the same geometry.

For air-sinterings of ceramic samples MLP without internal electrodes with the composition $Pb^{II}_{0.97}Nd^{III}_{0.02}V^{V}_{0.01}(Zr_{0.54}Ti_{0.46})O_3$ and under inert conditions, whereby the latter correspond to the requirements of a common sintering with copper, the results of the electrical measurings are compiled in table 2. Measurements of the polarized samples are set out in tables 3 to 5. In addition, the codes of a CuO-doped ceramic mass during sintering under inert conditions are also set out.

Table 2 includes characteristics of square ceramic samples MLP (edge length 1, consistency h): Samples (a), (b) and (c) with the composition $Pb_{0.97}Nd_{0.02}(Zr_{0.54}Ti_{0.46})O_3$. Sample (d) with the composition $Pd_{0.96}Cu_{0.02}Nd_{0.02}(Zr_{0.54}Ti_{0.46})O_3$ (a) powder pre-ground to a medium grain size d50%=0.53 μm, air-sintering at 1120° C.; (b), (c) and (d) powder finely ground to a medium grain size d50%=0.33 μm, air-sintered (b) at 1000° C. resp. (c) and (d) at 1000° C. under $N_2/H_2O$-steam are also set out.

| Sample MLP | h/mm | l/mm | C/nF | $\epsilon$ | Tan δ | $R_{IS}/\Omega$ | $\rho/\Omega$cm |
|---|---|---|---|---|---|---|---|
| (a) | 0.59 ± 0.02 | 10.8 ± 0.1 | 2.20 ± 0.05 | 1268 ± 30 | 2.1 ± 0.1% | $1*10^{11}$ | $2*10^{12}$ |
| (b) | 0.70 ± 0.01 | 10.6 ± 0.1 | 1.60 ± 0.03 | 1137 ± 58 | 2.8 ± 0.2% | $2*10^{11}$ | $3*10^{12}$ |
| (c) | 0.71 ± 0.02 | 11.0 ± 0.8 | 1.62 ± 0.07 | 1132 ± 81 | 2.8 ± 0.6% | $5*10^{9}$ | $9*10^{10}$ |
| (d) | 0.70 ± 0.01 | 11.3 ± 0.1 | 1.92 ± 0.01 | 1196 ± 8 | 1.9 ± 0.3% | $7*10^{10}$ | $1*12^{12}$ |

TABLE 3

Characteristics of square ceramic samples MLP (edge length 1, consistency h) with the composition according to table 2 after the polarity with 1200 V (a) and 1400 V ((b) and (c) and (d)).

| Sample MLP | h/mm | l/mm | C/nF | $\epsilon$ | Tan δ | $R_{IS}/\Omega$ | $\rho/\Omega$cm |
|---|---|---|---|---|---|---|---|
| (a) | 0.59 ± 0.02 | 10.8 ± 0.1 | 2.54 ± 0.13 | 1460 ± 134 | 1.9 ± 0.1% | $1*10^{11}$ | $2*10^{12}$ |
| (b) | 0.70 ± 0.01 | 10.6 ± 0.1 | 1.70 ± 0.03 | 1207 ± 58 | 2.1 ± 0.1% | $1*10^{11}$ | $2*10^{12}$ |
| (c) | 0.71 ± 0.02 | 11.0 ± 0.8 | 1.75 ± 0.05 | 1238 ± 69 | 2.3 ± 0.1% | $2*10^{11}$ | $5\,10^{12}$ |
| (d) | 0.70 ± 0.01 | 11.3 ± 01 | 2.11 ± 0.01 | 1317 ± 69 | 10.2 ± 0.8% | $8*10^{10}$ | $1*10^{12}$ |

The characteristic values prove that PZT ceramic samples, which were not air-bindered and were sintered, show comparable dielectrical characteristics.

| | Planar vibration | | | Consistency mode of vibration | | |
|---|---|---|---|---|---|---|
| MLP | $f_{S/kHz}$ | $f_{p/KHz}$ | $k_{eff}$ | $f_{S/kHz}$ | $f_{p/kHz}$ | $k_{eff}$ |
| (a) | 158 ± 1 | 191 ± 2 | 0.56 ± 0.01 | 3292 ± 15 | 3848 ± 79 | 0.52 ± 0.03 |
| (b) | 166 ± 2 | 198 ± 4 | 0.54 ± 0.01 | 2900 ± 78 | 3197 ± 25 | 0.42 ± 0.05 |
| (c) | 163 ± 1 | 189 ± 5 | 0.51 ± 0.04 | 2830 ± 111 | 3100 ± 108 | 0.40 ± 0.02 |
| (d) | 154 ± 2 | 186 ± 2 | 0.56 ± 0.03 | 2668 ± 36 | 3048 ± 47 | 0.48 ± 0.03 |

The results of table 4 are based on electromechanical vibration measurements with the aid of an impedance measuring bridge, whose evaluation from the parallel and serial resonance frequency fp, $f_s$ of the resonant circuit is effected according to the following:

$$f_s = \frac{1}{2\pi} \cdot \sqrt{\frac{1}{C_1 \cdot L_1}}$$

$$f_p = \frac{1}{2\pi} \cdot \sqrt{\frac{C_0 + C_1}{C_0 \cdot C_1 \cdot L_1}}$$

thereby permitting calculation for each vibration mode of the MLP sample of the effective coupling factor according to:

$$k_{eff}^2 = \frac{f_p^2 - f_s^2}{f_p^2} = \frac{\frac{C_0 + C_1}{C_0 \cdot C_1 \cdot L_1} - \frac{C_0}{C_0 \cdot C_1 \cdot L_1}}{\frac{C_0 + C_1}{C_0 \cdot C_1 \cdot L_1}} = \frac{C_1}{C_0 + C_1}.$$

As such, the proportion of the mechanical energy for the entire energy is indicated by $C_1/(C_0+C_1)$.

Table 4 depicts effective piezoelectrical coupling factors of the MLP samples from table 3 for two fundamental vibrations, determined from the measurement of each 3 MLP samples, sintered under the indicated conditions (a), (b), (c) and (d) in table 2.

The measurement of the Curie temperature at samples (c) show a value of 339±2° C.

Electromechanical coupling factors which are in the area of the air-sintered samples are accrued from the produced samples sintered commonly under these conditions with copper. The results of an excursion measurement on ceramic samples MLP are listed in table 5. The excursion Δh was determined parallely to the polarized direction 3, in which the measuring voltage was set. The excursion measurement was carried out by inductive path measuring by setting up an electrical field E with a field strength of 2000 V/mm. Prior to this measurement, the samples were impinged by a field strength of 2000 V/mm in the polarized direction to rule out after-polarity effects and increased hysteresis because of the bedding after the polarity.

The relative density S of the ceramic samples MLP is calculated from the measured excursion Δh divided by the sample consistency h. From this, the piezoelectrical coefficient $d_{33}$ results for the equation:

$$S_3 = d_{33} * E_3$$

wherein $d_{33}$ is a geometrically independent value for the piezoelectrical large signal characteristics of the examined ceramic.

Table 5 sets out an excursion measurement of square ceramic samples ML: (edge length 1, consistency h) with the composition according table 2 by setting a voltage of 2 kV/mm. Electrical measurement voltage U, excursion $\Delta h$, and the piezoelectrical constant $d_{33}$ are indicated.

| Sample MLP | h/mm | U/V | $\Delta h/\mu m$ | $d_{33} \cdot 10^{-12}$ m/V |
|---|---|---|---|---|
| (a) | 0.59 ± 0.02 | 1180 ± 4 | 0.88 ± 0.01 | 747 ± 10 |
| (b) | 0.70 ± 0.01 | 1400 ± 4 | 0.99 ± 0.01 | 712 ± 10 |
| (c) | 0.71 ± 0.02 | 1420 ± 4 | 1.03 ± 0.06 | 723 ± 40 |
| (d) | 0.70 ± 0.01 | 1400 ± 4 | 1.03 ± 0.01 | 739 ± 4 |

C. with 16 Cu-internal electrodes—and for comparison with 20 Ag/Pd-internal electrodes (70/30) after the air-sintering at 1120° C.—are indicated in table 6. Table 6 sets out electrical characteristics of PZT multilayer ceramic samples VS on the basis of the original composition $Pb^{II}_{0.97}Nd^{III}_{0.02}V'''_{0.01}(Zr_{0.54}Ti_{0.46})O_3$: (a) powder pre-ground, medium grain size d50%=0.53 µm, 20 internal electrodes Ag/Pd (70/30), air-sintering at 1120° C., (c) powder finely ground, medium particle size d50%=0.33 µm, 16 Cu-internal electrodes, sintering at 1000° C. under inert conditions by $N_2/H_2O$ steam.

| Sample VS | Comments | C/nF | $\epsilon$ before polarization | $\epsilon$ after polarization | tan δ after polarization | $\rho_{IS}/\Omega cm$ after polarization |
|---|---|---|---|---|---|---|
| (a) | Ag/Pd(70/30): Debindering/air-sintering 1120° C., Cu-finished. | 125 ± 5 | 1104 ± 54 | 1561 ± 92 | 0.015 | 7.9 10$^{11}$ |
| (c1) | Cu-internal electrodes: Debindering/sintering under $N_2/H_2O$ steam, Cu-finished. | 110 ± 4 | 908 ± 35 | 953 ± 37 | 0.027 | 2.7 10$^{10}$ |
| (c2) | Cu-internal electrodes: Debindering/sintering under $N_2$, $H_2O$ steam, Cu-finished. | 114 ± 4 | 946 | 1013 | 0.026 | 1.6 10$^{10}$ |

In case of printing on Cu-internal electrodes, a Cu-screen print paste is preferable which has a metal content as high as possible of approx. 75 m-% and is processed with a special high-polymer and is thereby a very viscous binder (which produces at already <2m-%, related to the solid substance content, a viscosity as thixotrope as possible, preferably >2000 mPa*s). First, multilayer samples "VS" with up to 20 internal electrodes are produced for sampling purposes. Thereafter, piezostacks with 100 to 300 Cu-internal electrodes are built up in a second step and are debindered and sintered under the above mentioned conditions of a defined oxygen partial pressure in the presence of steam.

The piezoceramic green foils are produced in a consistency, which produces, by considering the linear shrinkage during the sintering of typically 15%, a piezoceramic consistency from 20 to 200 µm. The Cu-electrodes have a layer consistency from 1 to 3 µm after the sintering.

Figure 2A:
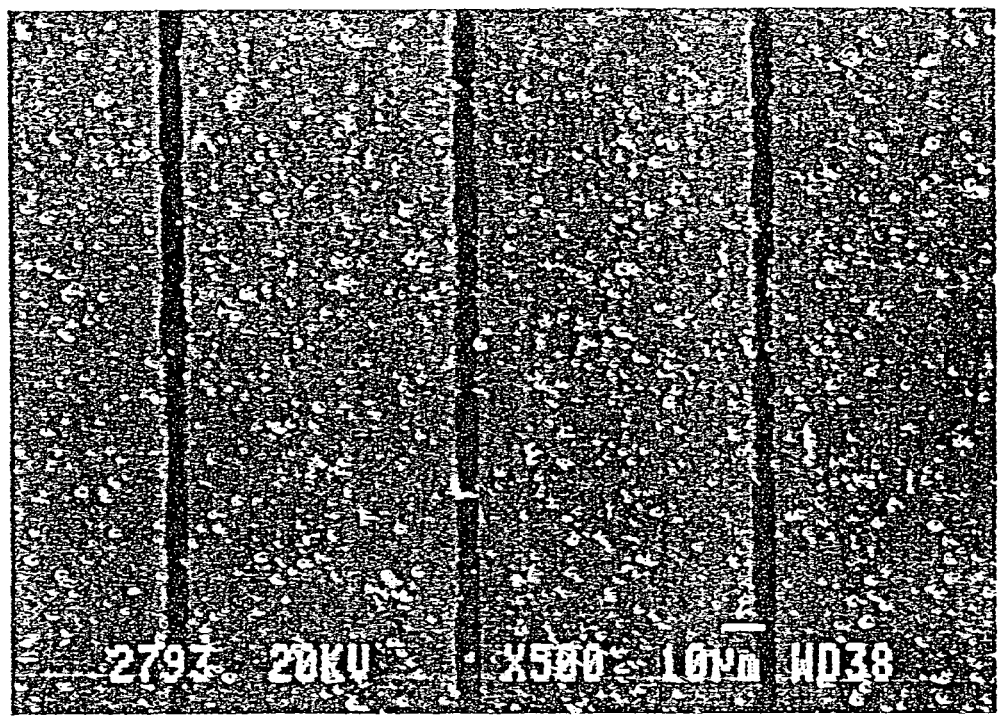
FIGS. 2a and 2b depict a partial cross section of a multi-layer stack with alternating sequence of PZT ceramic foils and Cu-internal electrodes.
Figure 2B:
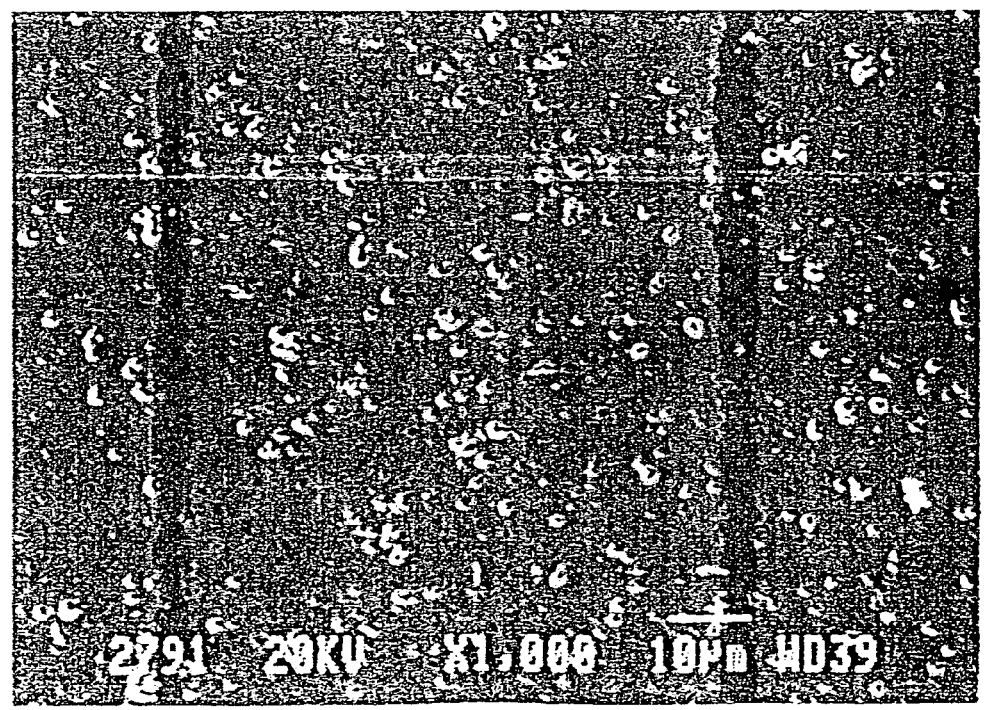

FIGS. 2a and 2b depict a schematic cross section of a multilayer stack with an alternating sequence of PZT ceramic foils and Cu-internal electrodes in 500 times (FIG. 2a) and in 1000 times (FIG. 2b) enlargement.

Figure 3A:
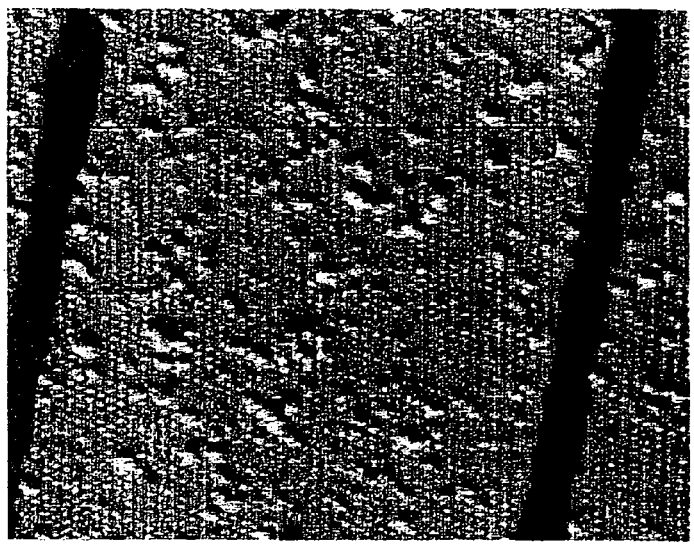
FIGS. 3a and 3b depict a measuring curve of copper content of piezoceramic layer and a section view of the piezoceramic layer.
Figure 3B:
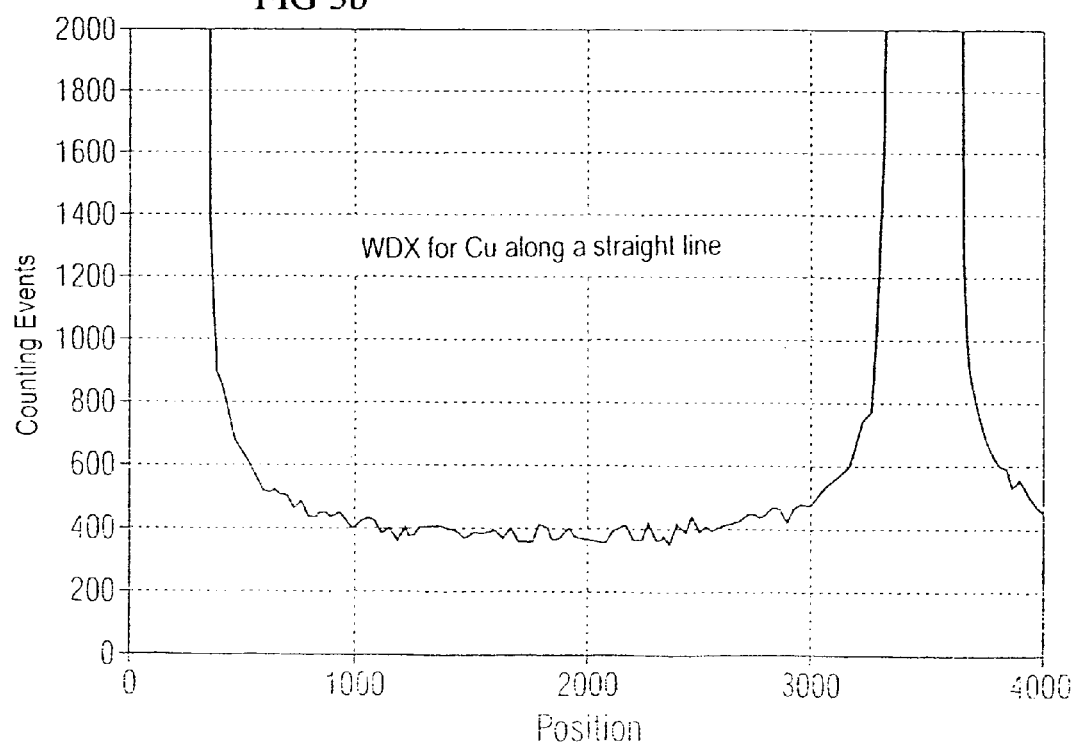

FIG. 3b shows a measuring curve for the Cu-content of the piezoceramic layer, shown in FIG. 3a, about the layer consistency after the sintering of a piezostack on the basis of the used original composition $Pb^{II}_{0.97-y}Nd_{0.02}Cu_yV'''_{0.01}(Zr_{0.54-z}Ti_{0.46+z})O_3$. It can be seen that the copper content in the ceramic layer dissolves starting from the border. The calibration produces in the middle of the ceramic layer the minimal amount of y=0.001. At the borders there is a value which is 20 times higher. Some lead oxide is displaced from the combination as a result of the influence of diffused Cu-ions. The good connection of the Cu-internal electrodes to the ceramic is thereby set out.

The electrical characteristics of the multilayer ceramic components VS of the original composition $Pb_{0.97}Nd_{0.02}V_{0.01}(Zr_{0.54}Ti_{0.46})O_3$ after the sintering at 1000°

Production of a piezo actuator from a ceramic of PZT type with Cu-internal electrodes.

For the production of piezo actuators with 160 Cu-internal electrodes, the green foils produced according to the method of the consistency from 40 to 50 µm are further processed according to the multilayer ceramic condensators method. The printing of the square cut PZT ceramic foils is done mechanically by screen printing technique (400 mesh) with the piezo actuators common electrode design by usage of a commercial Cu-electrode paste. The stacking is done such that on every two non-printed foils a printed one follows. 100 piezo actuators in a green condition are received from the block, after laminating, and pressing or sawing.

The debindering is carried out according to the FIG. 1 shown temperature time diagram in nitrogen stream by adding steam and hydrogen so that there is a target value from $5*10^{-2}$ to $2*10^{-1}$ Pa for the $O_2$ partial pressure produced in the area of 500° C. Essentially, lower oxygen partial pressures occur locally during the debindering. The ceramic is not subject to the reductive degradation in the temperature area of the debindering, because the equilibrated oxygen partial pressure is lowered as well, conditioned thermodynamically, and the reduction processes are kinetically sufficiently obstructed. The green parts of the multilayer piezo actuators still show a residue content of carbon of 300 ppm after the debindering and are afterwards ready to be sintered in the same set atmosphere without causing a reductive degradation which lead to cracking, delamination and eventually to drifting of the internal electrodes because of the production of a low melting Cu/Pb-alloy.

Steam and forming gas are added to the nitrogen flux ($N_2$+5% $H_2$). The dissociation of the steam according to

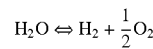

$$H_2O \Leftrightarrow H_2 + \frac{1}{2}O_2$$

is used for setting a certain oxygen partial pressure. Corresponding to the law of mass action $$K_D = \frac{p(O_2)^{\frac{1}{2}} \cdot p(H_2)}{p(H_2O)}$$

a certain oxygen partial pressure is thereby determined at a given temperature for a defined partial pressure ratio of steam and hydrogen. The calculation of the thermodynamic data produces the data depicted in FIG. 5, namely the curves for different $H_2/H_2O$ ratios of concentration.

Normally the gas composition is selected in such a way, that the requested oxygen partial pressure is produced at sinter temperature $T_{Sinter}$. This condition is for example depicted in FIG. 5. Starting from this value the $p(O_2)$ runs parallel to the other curves with decreasing temperature. However, the $p(O_2)$ value is low for $T<T_{Sinter}$, which is still tolerable if needed. The gas control curve Cu1 according to table 7 corresponds to this process. The equilibrium of Pb/PbO falls short starting at approx. 900° C., conditioned by the narrow thermodynamic window through which metallic lead is produced if there is sufficient kinetic activity.

Figure 5:
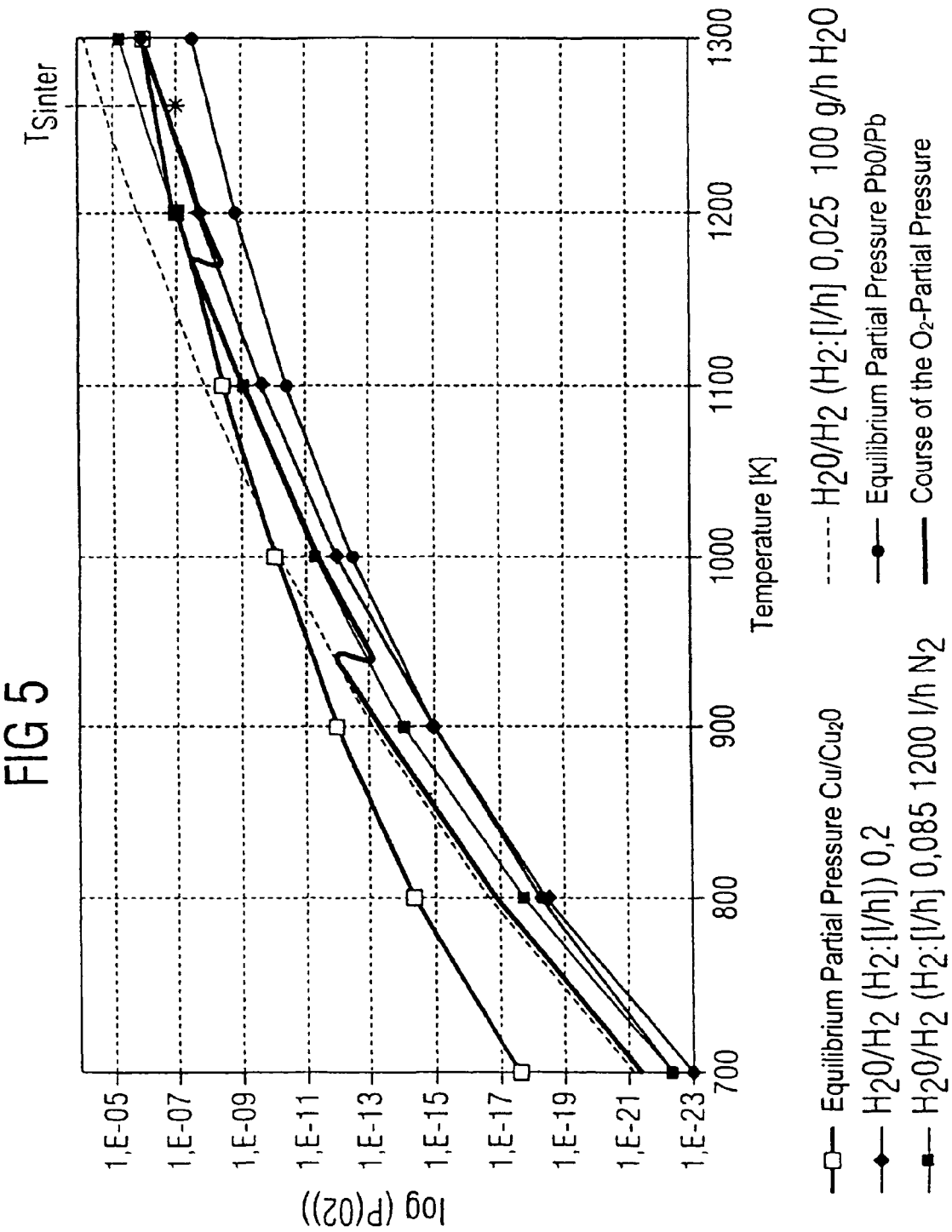
FIG. 5 depicts a calculation of thermodynamic data as curves for different $H_2/H_2O$ concentrations.

Alternatively, $p(O_2)$ was set with different forming gas dosage corresponding to the gas control Cu2—the actual course of the oxygen partial pressure at upto 400° C. lay in the thermodynamic window. This way of process is good for the little reductive solid PZT mixture. The used adjustments Cu1 and Cu2 for the gas control are indicated in table 7. FIG. 5 shows the calculated course of the partial pressure for the different ratios of concentration of the gases.

TABLE 7

Gas control Cu1 and Cu2

|  | Cu1 | Dosage | Cu2 | Dosage |
|---|---|---|---|---|
| $N_2$ | Entire sintering | 900 l/h | Entire sintering | 1200 l/h |
| $H_2/H_2O$ | Entire sintering | 40 g/h | Entire sintering | 100 g/h |
| $N_2 + 5\% H_2$ | Entrie sintering | 256 ml/h | 25-650° C. | 25 ml/h |
|  |  |  | 650-900° C. | 85 ml/h |
|  |  |  | 900-1000° C. | 200 ml/h |
|  | Dewing point 36° C. |  | Dewing point 48° C. |  |

The sinter profile is as follows: the holding time at maximal temperature lies between 2 and 12 hours. The heating up ramp and the cooling down ramp are effected at 5 K/min; and the actuators are slowly heated up at 1 K/min. The in steps adjusted set-up of the oxygen partial pressure (FIG. 5) runs in conformity with the temperature curve, which is obtained by an alteration of the forming gas flow meter. Thereby, the steam partial pressure (100 g/h) is constant.

The obtained ceramic is tightly sintered to >96% and shows mostly homogenous low porosity. The sinter grains grow according to the piezoelectrical characteristics with an advantageous medium grain size of 0.8-5 µm. Intact and crack-free actuators are obtained. The sequence of the internal electrodes and PZT ceramic layers is shown in a section in FIGS. 2a and 2b. The medium grain size in the ceramic structure is $d_{50}$=1.6 ±0.3 µm.

The piezo actuators are ground and polished for the finishing and contacted in the area of the exiting internal electrodes according to applications common to Cu-paste and burned-in at 935° C. according to a preset temperature time curve. The piezo actuators respond to the electrical measuring after the application of wires by known Bond technology.

Figure 4:
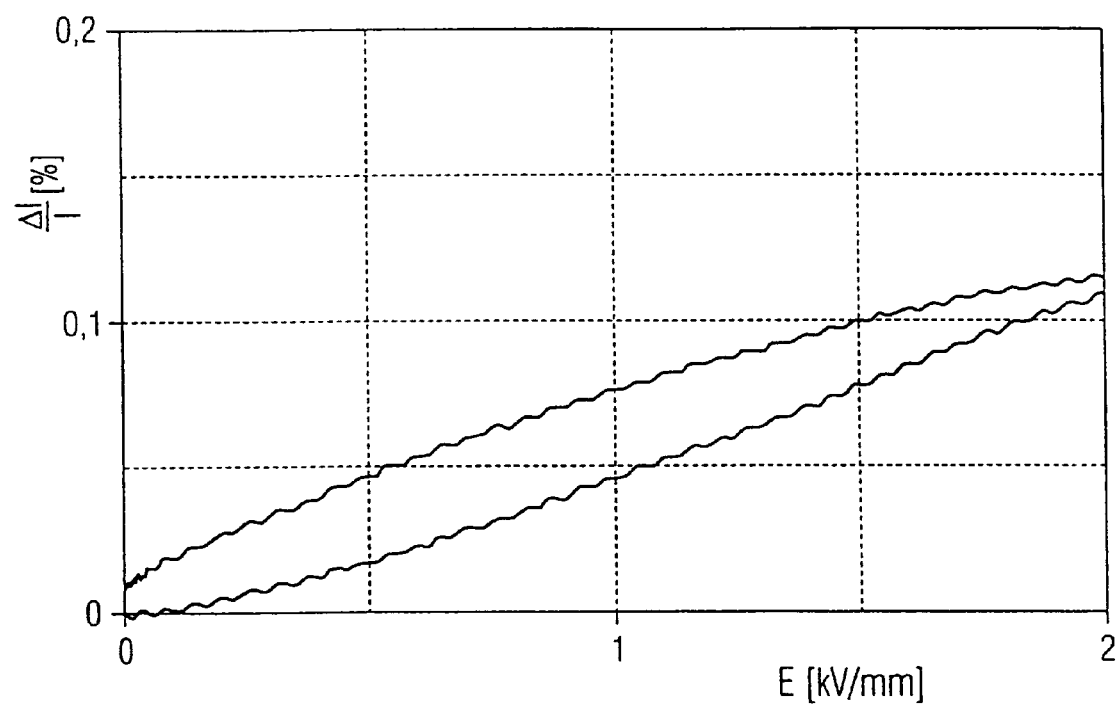
FIG. 4 depicts a diagram of an excursion curve for a polarized PZT-piezoactuator with Cu-internal electrodes.

The diagram of a vibration curve for a polarized PZT-piezoactuator with 160 Cu-internal electrodes is depicted in FIG. 4. A density of 0.123% is produced by a voltage setting of 140.6 Volt at a consistency of 70 µm of the PZT ceramic layers. The piezoelectrical coefficient in direction to the applied field $d_{33}$ is 614,6 $10^{-12}$ m/V.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A piezoelectric actuator, comprising a monolithic multilayer stack of at least two piezoelectric PZT ceramic layers and an electrode layer in between said two PZT ceramic layers, said electrode layer containing copper layered in between two ceramic greenfoils and sintered together with said greenfoils under inert conditions to form said stack of said two piezoelectric PZT ceramic layers and said electrode layer.

2. The actuator according to claim 1, wherein said multilayer stack is produced from ceramic green foils containing a thermohydrolithically degradable binder.

3. The actuator according to claim 2, wherein said binder is a polyurethane dispersion.

4. The actuator according to claim 1, wherein a density of said PZT ceramic layers is at least 96% of a theoretically obtainable density thereof.

5. The actuator according to claim 1, wherein said PZT ceramic layers contain grains having a grain size in a range between and including 0.8 and 5 µm.

6. The actuator according to claim 1, wherein said actuator includes at least 10 stacked electrode layers.

7. The actuator according to claim 1, wherein the ceramic of said two PZT ceramic layers is not reductively degraded.

8. The actuator according to claim 1, wherein said piezoelectric PZT ceramic is of the type $Pb(Zr_xTi_{1-x})O_3$ which relates to the general formula $ABO_3$ of a perovskite ceramic.

9. The actuator according to claim 8, wherein for partial substitution of quadrivalent cations Zr and Ti on B-positions of said perovskite ceramic, combinations of at least two of monovalent and quintvalent metal cations $M^I_{1/4}M^V_{3/4}$, with $M^I$=Na, K and $M^V$=Nb, Ta are used.

10. The actuator according to claim 8, wherein cations are built on A-positions of the ceramic and where cations on B-positions are replaced by suitable other cations or combinations of cations.

11. The actuator according to claim 10, wherein bivalent metal cations $M^{II}$ are built in on A-positions of the ceramic.

12. The actuator according to claim 11, wherein said bivalent metal cations $M^{II}$ are selected from a group comprising barium, strontium, calcium, and copper.

13. The actuator according to claim 10, wherein partially trivalent metal cations $M^{III}$ are built on the A-positions of said ceramic, and said metal cations $M^{III}$ are selected from a group comprising scandium, yttrium, bismuth, and lanthanum.

14. The actuator according to claim 10, wherein partially trivalent metal cations $M^{III}$ are built on the A-positions of said ceramic, and said metal cations $M^{III}$ are selected from the lanthanide group.

15. The actuator according to claim 10, wherein monovalent cations are integrated on the A-positions of said ceramic.

16. The actuator according to claim 15, wherein said monovalent cations are selected from a group comprising silver, copper, sodium, and potassium.

17. The actuator according to claim 10, wherein combinations of bivalent metal cations $M^{II}$ and monovalent cations are integrated on the A-positions of said ceramic.

18. The actuator according to claim 10, wherein for partial substitution of quadrivalent cations Zr and Ti on B-positions of said perovskite ceramic, at least one of bivalent and quintvalent metal cations $M^{II}_{1/3}M^{V}_{2/3}$ with $M^{II}$=Mg, Zn, Ni, Co and $M^{V}$=Nb, Ta are used.

19. The actuator according to claim 10, wherein for partial substitution of quadrivalent cations Zr and Ti on B-positions of said ferroelectrical perovskite ceramic, at least one of trivalent and quintvalent metal cations $M^{III}_{1/2}M^{V}_{2/3}$ with $M^{III}$=Fe, In, Sc, heavier lanthanide elements and $M^{V}$=Nb, Ta are used.

20. The actuator according to claim 10, wherein for partial substitution of quadrivalent cations Zr and Ti on B-positions of said ferroelectrical perovskite ceramic, combinations of at least two of $M^{III}_{2/3}M^{VI}_{1/3}$ with $M^{III}$=Fe, In, Sc, heavier lanthanide elements and $M^{VI}$=W are used.

21. The actuator according to claim 10, wherein for partial substitution of quadrivalent cations Zr and Ti on the B-positions of ferroelectrical perovskite ceramic, combinations of $M^{II}_{1/2}M^{VI}_{1/2}$ with $M^{II}$=Mg, Co, Ni and $M^{VI}$=W are used.

22. The actuator according to claim 10, wherein said ceramic comprises
$Pb_{1-x-y}SE_xCU_yV'''_{x/2}(Zr_{0.54-z}Ti_{0.46+z})O_3$, where V''' represents a vacancy, a PbO surplus is set from 1 to maximally 5 mol-%, SE is a rare earth metal, and $0.01<x<0.05$, $-0.15<z<0.15$, $0<y<0.06$.

23. The actuator according to claim 10, wherein said piezoelectric PZT ceramic is of the type $Pb(Zr_xTi_{1-x})O_3$ which relates to the general formula $ABO_3$ of a perovskite ceramic, and $Cu^{II}$ are built in on A-positions of the ceramic.

24. A piezoelectric actuator, obtainable by a process comprising the following steps:
   a) providing at least two piezoelectric PZT ceramic layers as ceramic greenfoils;
   b) providing an electrode layer containing copper;
   c) stacking said electrode layer between said two PZT ceramic layers to form a stack; and
   d) sintering said stack under inert conditions to a monolithic multilayer stack.

25. A piezoelectric actuator, comprising a monolithic multilayer stack of at least two piezoelectric PZT ceramic layers and an electrode layer in between said two PZT ceramic layers, said electrode layer containing copper and sintered together with said two PZT ceramic layers to form said stack, wherein the ceramic of said two PZT ceramic layers is not reductively degraded.

* * * * *